(12) United States Patent
Park et al.

(10) Patent No.: US 8,969,961 B2
(45) Date of Patent: Mar. 3, 2015

(54) FIELD-EFFECT TRANSISTOR AND METHOD FOR PRODUCING A FIELD-EFFECT TRANSISTOR

(75) Inventors: Jong Mun Park, Graz (AT); Verena Vescoli, Graz (AT); Rainer Minixhofer, Unterpremstaetten (AT)

(73) Assignee: AMS AG, Unterpremstaetten (AT)

( * ) Notice: Subject to any disclaimer, the term of this patent is extended or adjusted under 35 U.S.C. 154(b) by 490 days.

(21) Appl. No.: 12/742,219

(22) PCT Filed: Nov. 7, 2008

(86) PCT No.: PCT/EP2008/065157
§ 371 (c)(1),
(2), (4) Date: Aug. 25, 2010

(87) PCT Pub. No.: WO2009/060078
PCT Pub. Date: May 14, 2009

(65) Prior Publication Data
US 2010/0308404 A1 Dec. 9, 2010

(30) Foreign Application Priority Data
Nov. 9, 2007 (EP) .................................... 07120405

(51) Int. Cl.
*H01L 29/78* (2006.01)
*H01L 29/06* (2006.01)
(Continued)

(52) U.S. Cl.
CPC ........ *H01L 29/7835* (2013.01); *H01L 29/0634* (2013.01); *H01L 29/0847* (2013.01);
(Continued)

(58) Field of Classification Search
USPC ......................................................... 257/343
See application file for complete search history.

(56) References Cited

U.S. PATENT DOCUMENTS

| | | | |
|---|---|---|---|
| 5,164,804 A | 11/1992 | Terashima | |
| 5,242,841 A * | 9/1993 | Smayling et al. | ............. 438/275 |

(Continued)

FOREIGN PATENT DOCUMENTS

| | | |
|---|---|---|
| EP | 0634 798 | 1/1995 |
| GB | 2 309 336 | 7/1997 |
| JP | 62-58683 | 3/1987 |
| WO | WO 2004/102670 | 11/2004 |

OTHER PUBLICATIONS

Lin, J-L et al., "Characteristics of Superjunction Lateral-Double-Diffusion Metal Oxide Semiconductor Field Effect Transistor and Degradation after Electrical Stress", Japanese Journal of Applied Physics, Japan Society of Applied Physics, Tokyo, JP, vol. 45, No. 4A, Apr. 2006, pp. 2451-2454.

(Continued)

*Primary Examiner* — Jerome Jackson, Jr.
(74) *Attorney, Agent, or Firm* — McDermott Will & Emery LLP

(57) ABSTRACT

A semiconductor body (10) comprises a field-effect transistor (11). The field-effect transistor (11) comprises a drain region (12) of a first conduction type, a source region (13) of the first conduction type, a drift region (16) and a channel region (14) of a second conduction type which is opposite to the first conduction type. The drift region (16) comprises at least two stripes (15, 32) of the first conduction type which extend from the drain region (12) in a direction towards the source region (13). The channel region (14) is arranged between the drift region (16) and the source region (13).

17 Claims, 11 Drawing Sheets

(51) Int. Cl.
  *H01L 29/08* (2006.01)
  *H01L 29/66* (2006.01)
(52) U.S. Cl.
  CPC ....... *H01L29/66659* (2013.01); *H01L 29/0692* (2013.01); *H01L 29/0878* (2013.01); *H01L 29/66681* (2013.01); *H01L 29/7816* (2013.01)
  USPC .................. 257/343; 257/342; 257/E29.187; 257/E21.424

(56) References Cited

U.S. PATENT DOCUMENTS

| | | | | |
|---|---|---|---|---|
| 5,629,558 | A | * | 5/1997 | Galbiati et al. ............... 257/653 |
| 6,097,063 | A | * | 8/2000 | Fujihira ........................ 257/339 |
| 6,228,719 | B1 | | 5/2001 | Frisina et al. |
| 6,448,611 | B1 | | 9/2002 | Oh |
| 7,465,964 | B2 | * | 12/2008 | Udrea ........................... 257/122 |
| 7,602,037 | B2 | * | 10/2009 | Lin et al. ...................... 257/492 |
| 2009/0020812 | A1 | * | 1/2009 | Cheng ........................... 257/342 |

OTHER PUBLICATIONS

Park, I-Y, et al., "CMOS Compatible Super Junction LDMOST with N-Buffer-Layer", the 17th International Symposium on Power Semiconductor Devices and ICS, 2005, Proceedings, ISPSD '05, Santa Barbara, CA, USA, May 23-26, 2005, Piscataway, NJ, USA, IEEE, May 23, 2005, pp. 163-166.

Sonsky, J. et al., "Dielectric Resurf: Breakdown Voltage Control by STI layout in Standard CMOS", Int'l. Electron Devices Meeting IEDM, Dec. 5-7, 2005.

Vescoli, V., et al., "3D-Resurf: The Integration of a p-channel LDMOS in a Standard CMOS Process", Proceedings of the 20th Int'l. Symposium on Power Semiconductor Devices & IC's, May 18-22, 2008, Orlando, FL, pp. 123-126.

Hu, H-H et al., "Characterization of RF Lateral-Diffused Metal-Oxide-Semiconductor Field-Effect Transistors with Different Layout Structures", Japanese Journal of Applied Physics, Japan Society of Applied Physics, Tokyo, JP, vol. 46, No. 4B, Part 1, Apr. 1, 2007, pp. 2032-2036.

* cited by examiner

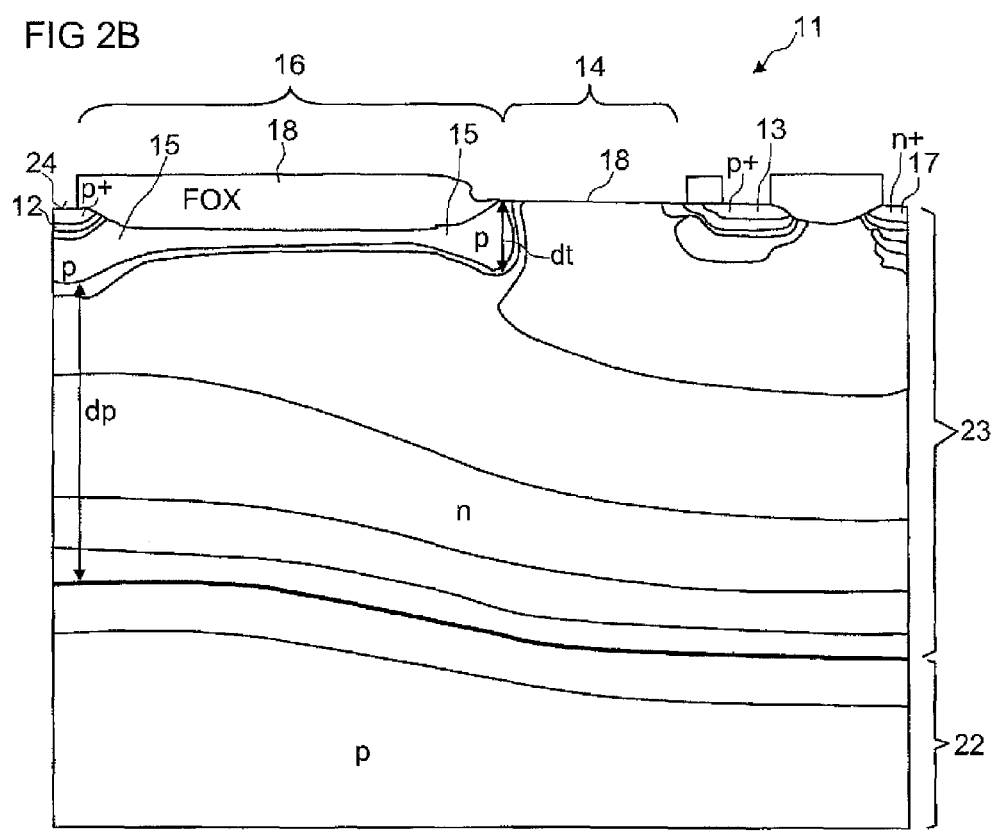

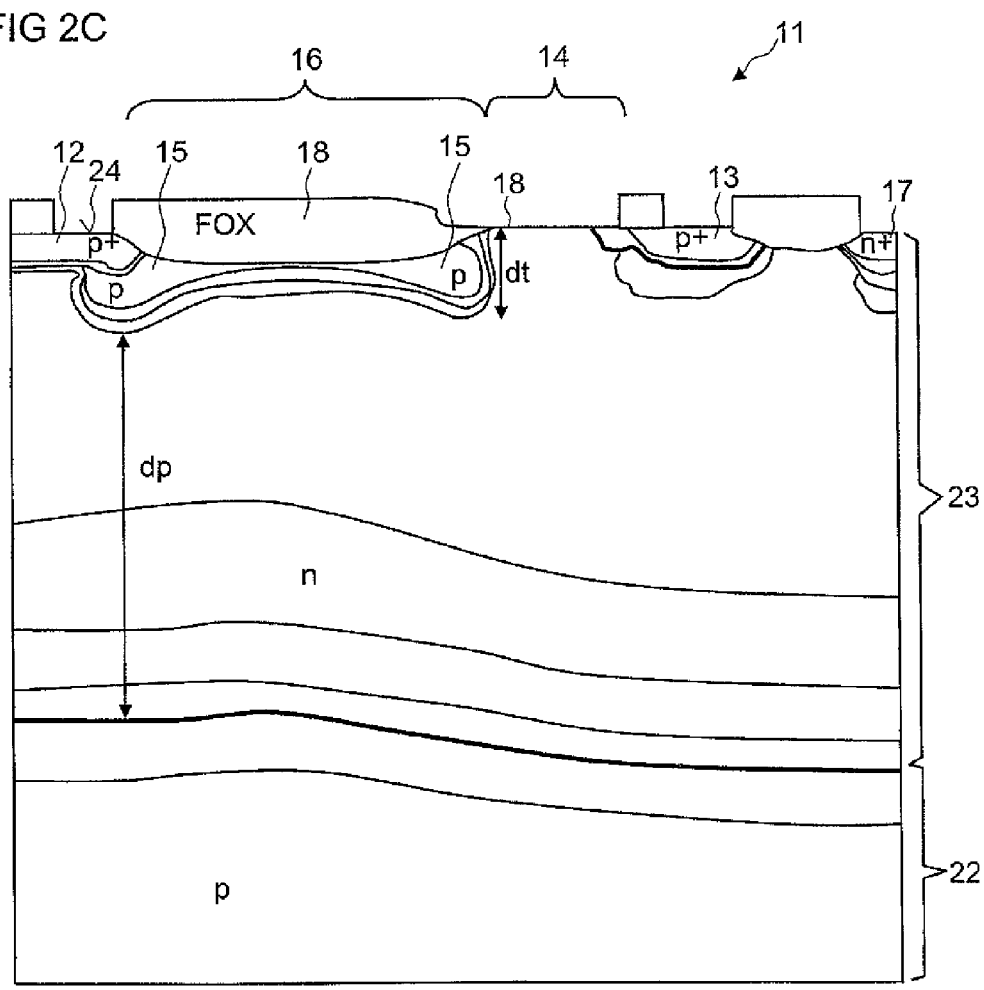

FIELD-EFFECT TRANSISTOR AND METHOD FOR PRODUCING A FIELD-EFFECT TRANSISTOR

RELATED APPLICATION

This is a U.S. National Phase under 35 U.S.C. §371 of International Application No. PCT/EP2008/065157, filed on Nov. 7, 2008, and claims priority on European patent application No. 07120405.1, filed on Nov. 9, 2007, the disclosure content of which is hereby incorporated by reference.

FIELD OF THE INVENTION

The present invention relates to a semiconductor body and a method for producing a field-effect transistor in a semiconductor body.

BACKGROUND OF THE INVENTION

A semiconductor body often comprises a field-effect transistor. The field-effect transistor comprises a drain region, a source region and a channel region between the drain region and the source region. For a realization of a high voltage field-effect transistor, the field-effect transistor further comprises a drift region between the drain region and the channel region. A large distance between the source region and the drain region as well as a low doping concentration of the drift region are commonly used. This results in a high breakdown voltage between the source region and the drain region but also in a large on-resistance. For the realization of the chosen doping level inside the drift region, an additional ion implantation step and a further implantation mask are commonly used which may not be comprised by a standard complementary-metal-oxide-semiconductor integration technology process.

Document WO 2004/102670 A2 refers to semiconductor devices such as diodes and transistors with a field-shaping region having an insulating material.

In the document "Dielectric Resurf: Breakdown Voltage Control by STI Layout in Standard CMOS", J. Sonsky, A. Hering a, International Electron Device Meeting IEDM, 5-7 Dec. 2005, IEDM technical digest, a field-effect transistor is described with an extended drain region comprising oxide-filled trenches.

SUMMARY OF THE INVENTION

It is an object of the present invention to provide a semiconductor body and a method for producing a field-effect transistor in a semiconductor body achieving a high breakdown voltage and a low on-resistance of a field-effect transistor.

According to an embodiment, a semiconductor body comprises a field-effect transistor. The field-effect transistor comprises a drain region, a source region, a drift region and a channel region. The channel region is arranged between the drift region and the source region. Furthermore, the drift region comprises at least two stripes which extend from the drain region in a direction towards the source region. The drain region, the source region and the at least two stripes are of a first conduction type. The channel region is of a second conduction type. The second conduction type is opposite to the first conduction type.

It is an advantage of the at least two stripes that a low value for an on-resistance of the field-effect transistor is achieved. This is advantageously attained in combination with a large distance between the drain region and the source region resulting in a high breakdown voltage. In case the field-effect transistor is switched on, a current may flow from the drain region through the stripes of the drift region and through the channel region to the source region.

In one embodiment, the field-effect transistor comprises a further source region of the first conduction type and a further drift region comprising at least two further stripes of the first conduction type. The further drift region extends from the drain region in a direction towards the further source region. Moreover, the field-effect transistor comprises a further channel region of the second conduction type. The further channel region is arranged between the further drift region and the further source region.

In a development, the further stripes are separated from the stripes. A distance is located between the stripes and the further stripes. The stripes and the further stripes do not touch each other. The separation reduces the doping concentration between the drain region and a substrate. Consequently, the punch-through behavior between the drain region and the substrate is improved.

In one embodiment, the at least two further stripes can be implemented such as the at least two stripes, for example in regard to their extensions, main directions and doping profiles.

The distance between the drift region and the source region may be referred to as a length of the channel region.

Preferably, the drain region, the source region, the channel region and the at least two stripes are located at a first main area of the semiconductor body. The drain region, the source region, the channel region and the at least two stripes comprise a semiconductor material.

In an embodiment, the at least two stripes extend substantially in parallel in a main direction. The main direction of the at least two stripes may be parallel to the first main area of the semiconductor body. The first main area is preferably a first main surface of the semiconductor body. The main direction of the at least two stripes is parallel to an imaginary connecting line between the drain region and the source region.

A first stripe of the at least two stripes may have a length which is the extension of the first stripe from the drain region in the direction towards the source region and the channel region. Preferably, a value of the length of the first stripe is higher than a value of a width of the first stripe.

In an embodiment, a width of a stripe has a value between 0.02 µm and 10 µm. Preferably, the width has a value between 0.1 µm and 2.0 µm.

The drift region preferably comprises a spacing which separates a first stripe of the at least two stripes from a second stripe of the at least two stripes. The spacing can have an extension with a value between 0.02 µm and 10 µm. The extension of the spacing preferably has a value between 0.1 µm and 2.0 µm. The spacing may also be referred to as a gap.

In an embodiment, the at least two stripes and the spacing between the at least two stripes form the drift region. The at least two stripes may form a current path inside the drift region. The spacing may form an isolating region of the drift region. Since the drift region does not have a homogenous doping, it is implemented as a discontinued drift region or curved drift region.

In one embodiment, the at least two stripes and the spacing advantageously form a super-junction. The super-junction structure is implemented by the at least two stripes and by the spacing having the second conduction type. By the at least two stripes, the spacing and a further spacing, alternating p-columns and n-columns are realized which implement the super-junction. The alternating p-regions and n-regions of the drift region result in an inhomogeneous doping of the drift region. The doping concentration in the drift region can provide a large depletion region in the drift region in case that the pn-junction between the drain region and the channel region is reverse biased. The large depletion region may result in an increased breakdown voltage between the drain region and the source region. The drift region is realized as a super-junction. The super-junction can be implemented by columns of the first conduction type and by columns of the second conduction type. The columns of the first conduction type are implemented by the stripes and the columns of the second conduction type are implemented by the spacings. The columns extend from the drain region in the direction towards the source region. A main direction of each of the columns is parallel to the first main area. The amount of positive charges of the dopants in a depleted part of the super-junction can be equal to the amount of negative charges of the dopants in the depleted part of the super-junction. A charge balance may exist between the stripes and the spacings in case of the super-junction.

In a further embodiment, the drift region is realized as a semi super-junction. The semi super-junction structure is implemented by the at least two stripes and by the spacing with a low doping concentration of the first conduction type. The spacing has a lower dopant concentration than the stripes. The semi super-junction structure can be realized by columns of the first conduction type and columns with a low doping concentration of the first conduction type. The columns of the first conduction type are implemented by the stripes and the columns with the low doping concentration of the first conduction type are implemented by the spacings. The columns with the low doping concentration of the first conduction type have a lower dopant concentration than the columns of the first conduction type. A waved doping profile is achieved by a semi super-junction. Preferably, the semi super-junction structure may comprise p-columns and weakly doped p-columns achieving a p-doping profile. The amount of positive charges of the dopants in a depleted part of the semi super-junction can be unequal to the amount of negative charges of the dopants in the depleted part of the semi super-junction. No charge balance may exist between the stripes and the spacings in case of the semi super-junction.

Thus the drift region can be realized as a super-junction structure or a semi super-junction structure.

In an embodiment, each of the at least two stripes has an interface to the drain region which has a large area.

In a preferred embodiment, the drain region comprises a boundary. The source region also comprises a boundary. A first straight line section of the boundary of the drain region is spaced apart to a first straight line section of the boundary of the source region and is parallel to the first straight line section of the boundary of the source region. The main direction of the at least two stripes is approximately perpendicular to the first straight line section of the boundary of the drain region. The main direction of the at least two stripes is approximately also perpendicular to the first straight line section of the boundary of the source region.

The field-effect transistor preferably comprises a gate insulator. The gate insulator is arranged on top of the drift region and the channel region.

In an embodiment, the gate insulator has a constant thickness. In a preferred embodiment, the gate insulator comprises a first area having a first thickness and a second area having a second thickness which is higher than the first thickness. The gate insulator advantageously has the first thickness in the first area which is adjacent to the source region. The gate insulator with the first thickness may be realized as a gate oxide. The gate insulator has the second thickness preferably in the second area on the drift region. The gate insulator with the second thickness can be implemented as a field oxide. Alternatively, the gate insulator with the second thickness can be realized by a shallow trench insulation process. The first area can be on top of the channel region and on top of a part of the drift region. The second area can be on top of another part of the drift region. The super-junction or semi super-junction structure is to a large extent arranged under the field oxide or under the shallow trench isolation and to a small extent under the gate oxide.

In a development, the field-effect transistor comprises a gate electrode that is arranged on top of the gate insulator.

The gate electrode preferably may be arranged on top of the first area of the gate insulator. Additionally, the gate electrode may also be arranged on the second area of the gate insulator.

In a further development, the first area of the gate insulator and a part of the second area of the gate insulator are covered by the gate electrode. The gate insulator which is arranged on the drift region is only partly covered by the gate electrode. Thus a further part of the second area of the gate insulator is uncovered by the gate electrode. The further part of the second area of the gate insulator is located on top of a part of the drift region. This results in an efficient control of an inversion layer at the interface of the channel region to the gate insulator and an efficient control of an electric field distribution at the drift region. Thus the gate electrode efficiently controls a drain-source current which flows from the drain region through the channel region to the source region.

In an embodiment, the field-effect transistor is implemented as a power field-effect transistor. The field-effect transistor may be realized as a high-voltage transistor. A blocking voltage of the field-effect transistor can be higher than 25 Volt. The field-effect transistor is designed as a lateral transistor. Also, the field-effect transistor can be implemented as a double-diffused metal oxide semiconductor field-effect transistor, abbreviated DMOS transistor. The field-effect transistor may be realized as a laterally diffused metal oxide semiconductor field-effect transistor, abbreviated LDMOS transistor.

The drain region comprises a first doping profile. The doping profile is a function of the doping concentration versus a location at a direction perpendicular to the main area of the semiconductor body starting at the first main area. The source region preferably may have the first doping profile. The channel region has a second doping profile. The at least two stripes can have the first doping profile in the drift region. Preferably, the at least two stripes have a third doping profile which is different from the first doping profile. The spacing between the at least two stripes may have the doping profile of the channel region and thus the second doping profile.

In a development, a body region is adjacent to the source region. The body region is of the second conduction type. The body region has a higher doping concentration compared to the drift region. The body region and the channel region surround the source region. A threshold voltage of the field-effect transistor is determined by the doping concentration of the channel region.

In an embodiment, the semiconductor body comprises a well which comprises the field-effect transistor. The well is of the second conduction type. In a further development, the semiconductor body comprises an additional well. The additional well has the first conduction type. The additional well comprises an additional field-effect transistor. Thus the stripes of the drift region of the field-effect transistor have the same conduction type as the additional well. The stripes and the additional well can be realized by the same doping step.

Therefore, the same mask and the same ion implantation step can be used for the realization of the stripes and of the additional well. Thus the additional well and the at least two stripes have the third doping profile.

In an embodiment, the field-effect transistor is an n-channel field-effect transistor in a p-doped well. The stripes are n-doped. Also the additional well is n-doped and the additional field effect transistor is a p-channel transistor. In a preferred embodiment, the field-effect transistor is a p-channel field-effect transistor with p-doped stripes in an n-doped well. The additional well is a p-well and the additional field effect transistor is an n-channel transistor.

In one development, the at least two stripes are fabricated by two doping steps which are implemented as a well doping step and as a field doping step. After the well doping step and before the field doping step, a diffusion step and/or an oxidation step can be performed.

In an embodiment, a method for producing a field-effect transistor in a semiconductor body comprises executing a first doping step with a first dopant at a first main area of the semiconductor body. Further on, the method comprises to execute a second doping step with a second dopant at the first main area and executing a temperature control for diffusion of the first dopant to produce at least two stripes and for diffusion of the second dopant to produce a source region and a drain region. The at least two stripes extend from the drain region in a direction towards the source region. Moreover, a gate electrode is deposited for the control of the field-effect transistor. The field-effect transistor comprises the drain region, the source region, the at last two stripes and the gate electrode.

Preferably, a gate insulator is deposited on the drift region and the channel region. Further on, the gate electrode is deposited on the gate insulator.

In an embodiment, the first doping step is a well doping step. The first doping step can be an n well doping step. Alternatively, the first doping step can be a p well doping step. The second doping step can be a source doping step.

In an embodiment, at least two further stripes of the field-effect transistor are produced by the first doping step and the thermal treatment for the diffusion of the first dopant of the first doping step. Moreover, a further source region of the field-effect transistor is produced by the second doping step and the thermal treatment for the diffusion of the second dopant of the second doping step.

The at least two further stripes can extend from the drain region in a direction towards the further source region. The further stripes can be separated from the stripes.

In an embodiment, the first and the second doping step each comprise an ion implantation step.

The thermal control can also be named as thermal processing or temperature treatment. Preferably, the thermal treatment can be executed by providing heat to the semiconductor body and controlling a temperature/time profile for heating. This results in a diffusion of the dopants inside of the semiconductor body. The thermal treatment may be performed together with an oxidation step. The thermal treatment may be executed in an inert atmosphere without an oxidation step. The thermal treatment in an inert atmosphere can be implemented as a rapid thermal process or a furnace process.

In an embodiment, a diffusion of the first and the second dopant is performed in a first process step. In an alternative embodiment, a diffusion of the first dopant is executed in the first process step, then the second doping step is performed and a diffusion of the first and the second dopant is executed in a second process step. Thus a more precise control of the doping distributions is achieved.

In one embodiment, a field doping step at the first main area is additionally executed to produce the at least two stripes of the field-effect transistor. The field doping step can comprise a field implantation step. Thus, the first doping step and the field doping step can be used to produce the at least two stripes. The first doping step and the field doping step effect a doping concentration of the stripes which is high enough to overcome the doping concentration of the well in which the stripes are arranged.

BRIEF DESCRIPTION OF THE DRAWINGS

The following description of figures of exemplary embodiments may further illustrate and explain the invention. Devices, regions and layers with the same structure or with the same effect appear with equivalent reference numerals. The description of a device, a region and a layer having the same function in different figures might not be repeated in each of the following figures.

FIGS. 2A to 2C show exemplary embodiments of dopant distributions in different cross-sections of a semiconductor body with a field-effect transistor of the invention.

DETAILED DESCRIPTION OF THE DRAWINGS

Figure 1A:
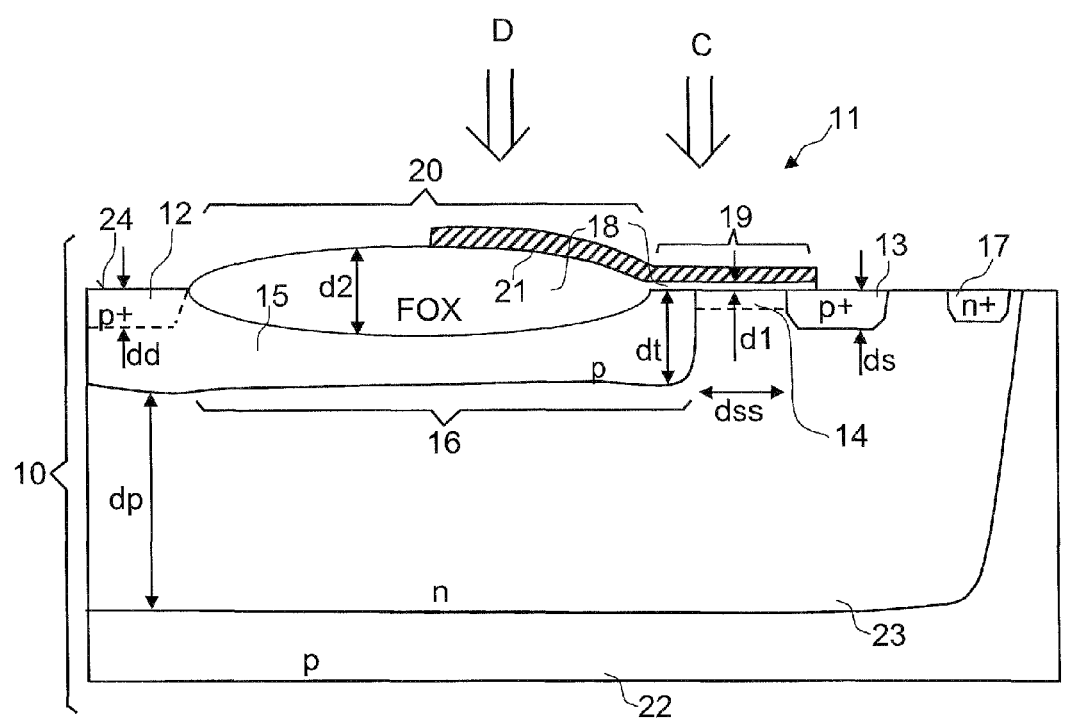
FIGS. 1A to 1C show exemplary embodiments of a semiconductor body with a field-effect transistor of the invention.

FIG. 1A shows an exemplary embodiment of a semiconductor body with a field-effect transistor of the invention in a cross-section. The semiconductor body 10 comprises the field-effect transistor 11. The field-effect transistor 11 comprises a drain region 12 and a source region 13. Moreover, the field-effect transistor 11 comprises a drift region 16 and a channel region 14 which are arranged between the drain region 12 and the source region 13. The drift region 16 is adjacent to the drain region 12. The channel region 14 is adjacent to the source region 13. The drift region 16 is located between the drain region 12 and the channel region 14. Additionally, the drift region 16 comprises a first stripe 15. The first stripe 15 is a region that extends from the drain region 12 towards the channel region 14. The semiconductor body 10 also comprises a bulk contact region 17.

Furthermore, the field-effect transistor 11 comprises a gate insulator 18. A first area 19 of the gate insulator 18 covers the channel region 14, a part of the drift region 16 and a part of the source region 13. The gate insulator 18 has a first thickness d1 in the first area 19. The first area 19 has a small overlap to the source region 13. Additionally, the first area 19 has a small overlap to the drift region 16. A second area 20 of the gate insulator 18 covers a part of the drift region 16. The gate insulator 18 has a second thickness d2 in the second area 20. Furthermore, the field-effect transistor 11 comprises a gate electrode 21 which is arranged on top of the gate insulator 18. The gate electrode 21 at least partially covers the gate insulator 18. The gate electrode 21 covers the gate insulator 18 in the first area 19 of the gate insulator 18. Furthermore, the gate electrode 21 covers the gate insulator 18 in a part of the second area 20. The gate insulator 18 comprises silicon dioxide. The gate insulator 18 inside the first area 19 is implemented as a high quality isolating layer. The gate insulator 18 with the first thickness d1 is realized as a gate oxide. The gate insulator 18 inside the second area 20 is implemented as a field oxide. The gate electrode 21 comprises polysilicon.

Furthermore, the semiconductor body 10 comprises a substrate 22 which comprises a well 23. The well 23 comprises the field-effect transistor 11 and the bulk contact region 17. The drain region 12, the source region 13 and the first stripe 15 are of a first conduction type that is p doped. The channel region 14 is of a second conduction type that is opposite to the first conduction type and thus is n doped. The drain region 12 and the source region 13 have a higher doping concentration in comparison to the first stripe 15. Thus, the drain region 12 and the source region 13 are p+ doped and the first stripe 15 is p doped. The well 23 and the bulk contact region 17 are also of the second conduction type. The bulk contact region 17 is n+ doped, while the well 23 is n doped.

The semiconductor body 10 has a first main area 24. The drain region 12, the source region 13, the first stripe 15 and the bulk contact region 17 are arranged at the first main area 24. An extension dd of the drain region 12 perpendicular to the first main area 24 is approximately equal to an extension ds of the source region 13 perpendicular to the first main area 24. An extension dt of the first stripe 15 perpendicular to the first main area 24 has a larger value than the extensions dd, ds of the drain region 12 and the source region 13. The semiconductor body 10 comprises a first arrangement of layers in the first area 19 of the gate insulator 18. The first arrangement comprises the substrate 22, the well 23, the gate insulator 18 with the first thickness d1 and the gate electrode 21. The semiconductor body 10 comprises a second arrangement of layers in the second area 20 of the gate insulator 18. The second arrangement comprises the substrate 22, the well 23, the first stripe 15, the gate insulator 18 with the second thickness d2 and the gate electrode 21. A location of the first arrangement is indicated with an arrow C and a location of the second arrangement is indicated with an arrow D. The substrate 22 and the drift region 16 are separated by an extension dp. Thus the drain region 12 and the substrate 22 are separated by the extension dp. The extension dp is orthogonal to the first main area 24.

The field-effect transistor 11 is implemented as a p-channel field-effect transistor. The field-effect transistor 11 is realized as a high voltage field-effect transistor. The field-effect transistor 11 is designed as a lateral transistor.

It is an advantage of the first stripe 15 that a high conductivity between the drain region 12 and the source region 13 is achieved. The deposition of a part of the gate electrode 21 on the gate insulator 18 with the second thickness d2 advantageously improves a trade-off between a blocking voltage and an on-resistance of the field-effect transistor 11. The extension dp has advantageously a value which is high enough to avoid a punch-through between the drain region 12 and the substrate 22.

A source electrode, which is not shown, is arranged on top of the source region 13 and a drain electrode, which is also not shown, is arranged on top of the drain region 12.

In an alternative embodiment, which is not shown, the drain region 12, the source region 13 and the first stripe 15 are n doped. The channel region 14 and the well 23 are p doped.

Thus the field-effect transistor 11 is implemented as an n-channel field-effect transistor. The substrate 22 can be n doped.

In an alternative embodiment, which is not shown, the gate insulator 18 with the second thickness d2 is produced by a shallow trench isolation process.

Figure 1B:
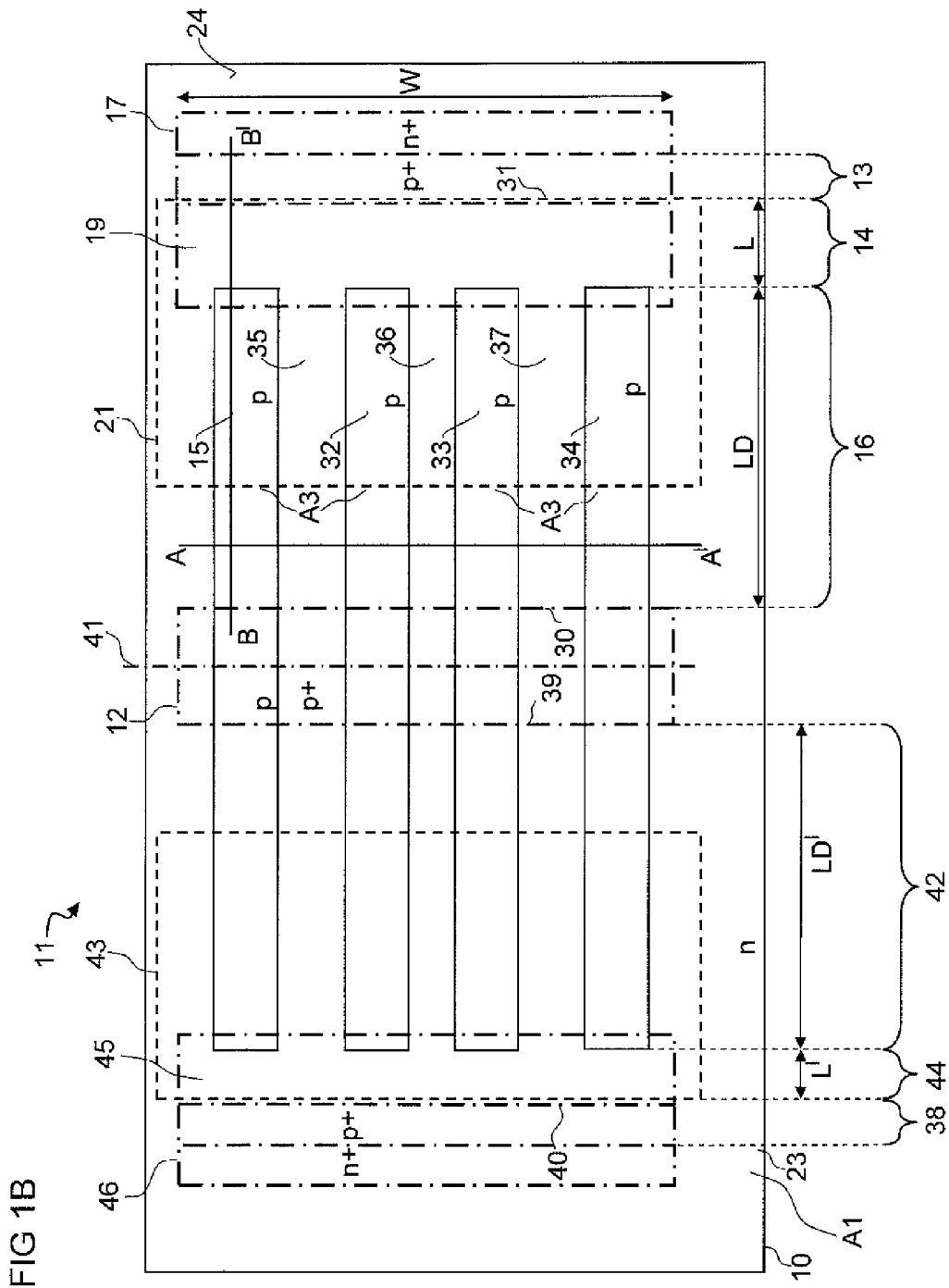

FIG. 1B shows a top view of an exemplary embodiment of the semiconductor body with the field-effect transistor according to the invention. FIG. 1A shows a cross-section at a line BB' of FIG. 1B. In the top view, the drain region 12 has an approximately rectangular form and the source region 13 also has an approximately rectangular form. A first straight line section 30 of a boundary of the drain region 12 and a first straight line section 31 of a boundary of the source region 13 which is spaced apart to the first straight line section 30 of the drain region 12 are approximately parallel. The field-effect transistor 11 comprises the drift region 16 and the channel region 14 between the drain region 12 and the source region 13. The drift region 16 has a length LD which is a distance of the first straight line section 30 of the drain region 12 to the end of the first stripe 15. The channel region 14 has a length L which is a distance of the drift region 16 to the first straight line section 31 of the source region 13. The length L of the channel region 14 has a smaller value than the length LD of the drift region 16. The channel region 14 additionally has a width W that is the extension of the channel region 14 perpendicular to the length L of the channel region 14. Moreover, the field-effect transistor 11 comprises the first stripe 15, a second stripe 32, a third stripe 33 and a fourth stripe 34. The first, second, third and fourth stripes 15, 32 to 34 extend from the drain region 12 up to the channel region 14. Thus the four stripes 15, 32 to 34 connect the drain region 12 to the channel region 14. The four stripes 15, 32 to 34 have a rectangular form. The four stripes 15, 32 to 34 are arranged in parallel. A main direction of the first stripe 15 is approximately perpendicular to the first straight line section 30 of the boundary of the drain region 12. The main directions of the second to the fourth stripes 32 to 34 are also approximately perpendicular to the first straight line section 30 of the drain region 12. The main directions of the four stripes 15, 32 to 34 are also approximately perpendicular to the first straight line section 31 of the source region 13. The length LD of the four stripes 15, 32 to 34 from the drain region 12 towards the source region 13 has a larger value than a width of the first stripe 15. The widths of the four stripes 15, 32 to 34 are approximately equal. In the top view, the bulk contact region 17 has a rectangular form which is arranged nearby the source region 13. The gate electrode 21 covers a part of the channel region 14 which is located near the source region 13. The gate electrode 21 has a rectangular form in the top view. A first area A1 comprises the well 23. A third area A3 comprises the stripes 15, 32 to 34.

The drift region 16 comprises a first spacing 35 between the first stripe 15 and the second stripe 32. The first stripe 15 has a width of between 0.1 μm and 2.0 μm. The first spacing 34 also has a width of between 0.1 μm and 2.0 μm. Moreover, a second spacing 36 separates the second stripe 32 and the third stripe 33. Furthermore, a third spacing 37 separates the third stripe 33 and the fourth stripe 34.

Additionally, the field-effect transistor 11 comprises a further source region 38. The further source region 38 is arranged spaced apart to the drain region 12. The further source region 38 is nearby the drain region 12. The boundary of the drain region 12 has a second straight line section 39 which is parallel to the first straight line section 30. The second straight line section 39 is spaced apart to the further source region 38. The further source region 38 has an approximately rectangular form in the top view. A first straight line section 40 of a boundary of the further source region 38 is near and approximately parallel to the second straight line section 39 of the drain region 12. An imaginary connecting line from the source region 13 to the further source region 38 crosses the drain region 12. The line is a straight line. The source region 13 and the further source region 38 form a symmetrical structure with a symmetry axis 41 which is located in the drain region 12. The four stripes 15, 32 to 34 are extended from the drain region 12 in a direction towards the further source region 38. The field-effect transistor 11 comprises a further channel region 44 and a further drift region 42 between the drain region 12 and the further source region 38 as well as a further gate insulator and a further gate electrode 43. The four stripes 15, 32 to 34 connect the drain region 12 to the further channel region 44. The further gate electrode 43 covers the further channel region 42, a part of the further drift region 42 and a part of the further source region 38. The further drift region 44 has a length LD' and the further channel region 44 has a length L'. The field-effect transistor 11 comprises a further bulk contact region 46 which is adjacent to the further source region 38.

It is an advantage of the stripes 15, 32 to 34 that an on-resistance between the drain region 12 and the source regions 13, 38 has a very low value. The stripes 15, 32 to 34 provide an efficient current path between the source regions 13, 38 and the drain region 12. The low value of the on-resistance is achieved although the length LD of the drift region 16 and a further length LD' of the further drift region 42 have a high value to obtain a high breakdown voltage between the drain region 12 and the source regions 13, 38. The breakdown voltage is determined by the lengths LD, LD' and the doping concentration in the drift regions 16, 42. The lengths L, L' are approximately equal. The lengths LD, LD' are also approximately equal. Thus the field-effect transistor 11 has a symmetrical structure with respect to the symmetry axis 41.

The four stripes 15, 32 to 34 extend from the drain region towards the source regions 13, 38 but are not connected to the source regions 13, 38. The four stripes 15, 32 to 34 have a distance dss to the source regions 13, 38 as indicated in FIG. 1A, which is equal to the length L, L'.

In an alternative embodiment which is not shown, the field-effect transistor 11 comprises further stripes which are arranged in parallel to the four stripes 15, 32 to 34.

Figure 1C:
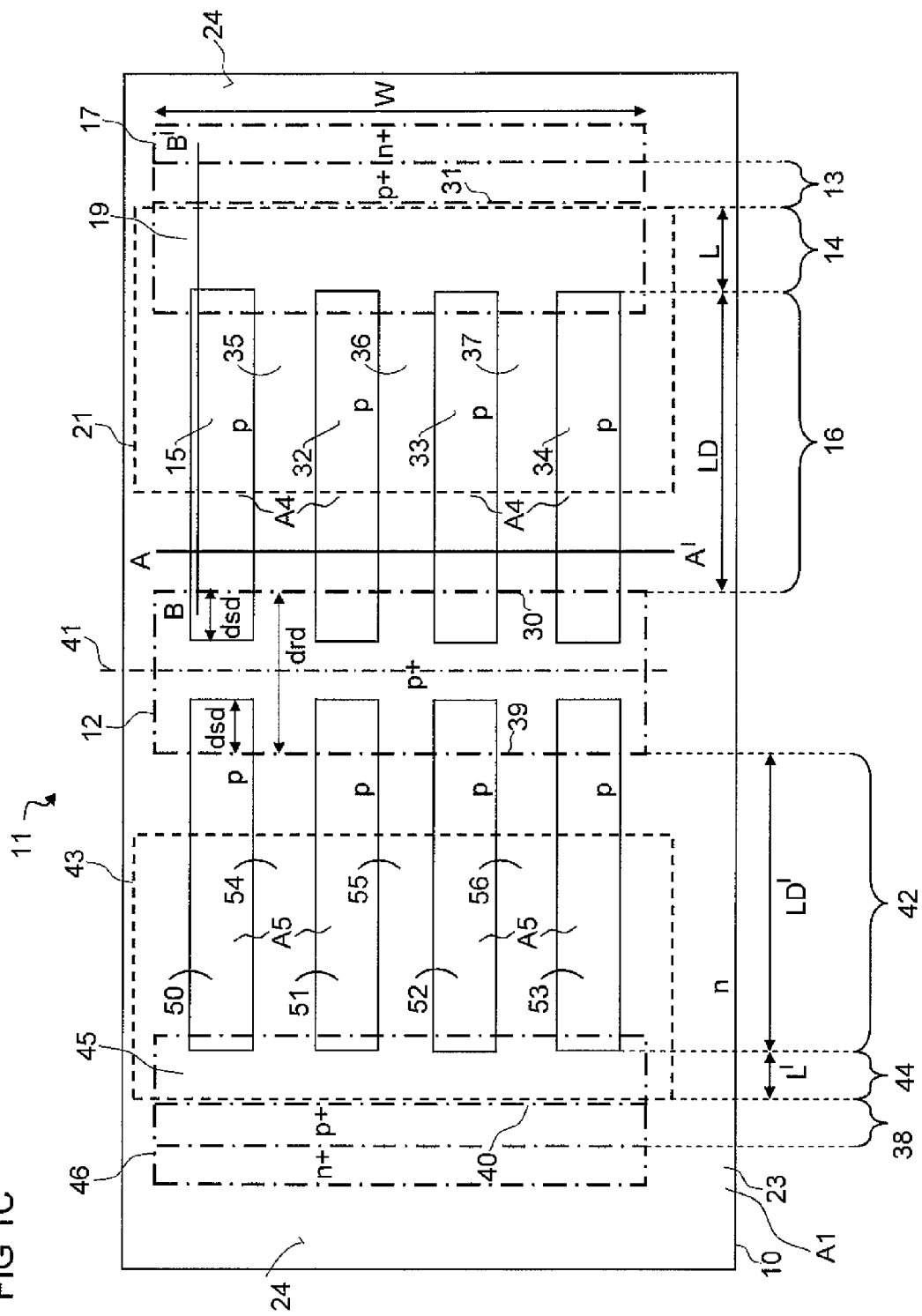

FIG. 1C shows an alternative exemplary embodiment of a semiconductor body with a field-effect transistor in a top view. The embodiment according to FIG. 1C is a further development of the embodiment of FIG. 1B. FIG. 1A shows a cross-section at a line BB' of FIG. 1C. The four stripes 15, 32 to 34 extend from the drain region 12 towards the source region 13 but show only a small overlap with the drain region 12. The overlap of the four stripes 15, 32 to 34 with the drain region 12 has an extension dsd. The drain region 12 has an extension drd in the direction of the stripes 15, 32 to 34. The extension dsd is 5% of the extension drd. The further drift region 42 comprises further stripes 50 to 53 and further spacings 54 to 56. The further stripes 50 to 53 extend from the drain region 12 to the further channel region 44. The further stripes 50 to 53 also have only a small overlap with the drain region 12. The further stripes 50 to 53 are separated from the four stripes 15, 32 to 34. A fourth area A4 comprises the stripes 15, 32 to 34. A fifth area A5 comprises the further stripes 50 to 53. The outlines of the different regions and layers shown in FIGS. 1B and 1C are similar to a mask layout for the semiconductor body.

It is an advantage of this embodiment that a punch-through behaviour between the drain region 12 and the substrate 22 is improved, so that a probability for the punch-through is reduced. By the separation of the further stripes 50 to 53 and the stripes 15, 32 to 34, an undesired punch-through between the drain region 12 and the substrate 22 is avoided. The extension dsd of the overlap has a value out of an interval that comprises 0% to 20% of the extension drd of the drain region 12 in the direction of the stripes 15, 32 to 34. Preferably, the extension dsd has a value out of an interval which comprises 0% to 10% of the extension drd.

Figure 2A:
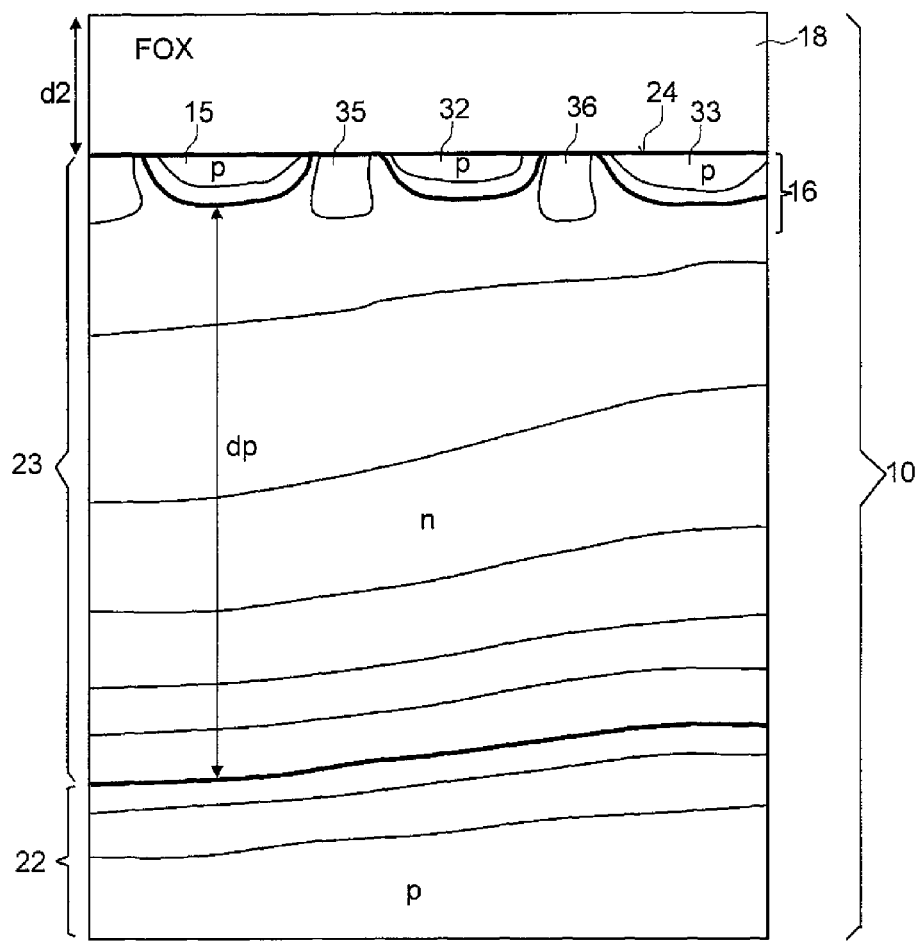

FIG. 2A shows an exemplary embodiment of a dopant distribution in the semiconductor body of the invention. FIG. 2A shows the distribution of doping atoms in a cross-section of the field-effect transistor 11 indicated by a line AA' in FIGS. 1B and 1C inside of the drift region 16. Therefore, FIG. 2A shows a cross-section parallel to the width W of the channel region 14. FIG. 2A shows the first, the second and the third stripes 15, 32, 33 and the spacings 35, 36. The stripes 15, 32, 33 are located in the well 23. The well 23 is arranged on top of the substrate 22. The gate insulator 18 with the second thickness d2 covers the drift region 16. The stripes are realized by a p-well doping process, a p-field implantation process and an anti-punch-through implantation process. The doping atoms of the stripes 15, 32, 33 compensate an amount of the doping atoms of the well 23.

The p-wells stripes 15, 32, 33 together with the p-field implantation and the anti-punch-through implantation are used to form the p-drift region 16 in the n-well 23. The p-well stripes 15, 32, 33 compensate a certain amount of a dose of the n-well 23 and form together with the p-field implantation and the anti-punch-through implantation the p-drift region 16 under the field oxide or shallow trench isolation. The n-well 23 is counterdoped by the p-well stripes 15, 32, 33.

According to the small dimensions of the stripes 15, 32, 33 and the spacings 35, 36, the drift region 16 is realized as a super-junction structure. The super-junction structure has alternating p-columns and n-columns to form the drift region 16. The p-columns are implemented by the stripes 15, 32, 33 and the n-columns are realized by the spacings 35, 36.

In an alternative embodiment the drift region 16 is realized as a semi super-junction structure. The semi super-junction comprises p-columns and weakly p-doped columns. The p-columns are implemented by the stripes 15, 32, 33. The weakly p-doped columns are realized by the spacings 34, 35, wherein the n-well doping is counterdoped by the out-diffusion of the p-doped stripes. This can be achieved by a small value of a width of the spacings 35, 36 which is a distance of the stripes 15, 32, 33. The p-columns have a higher dopant concentration in comparison to the weakly p-doped columns. Since the p-field implantation process and the anti-punch-through implantation process are comprised by a standard complementary metal-oxide semiconductor technology process, abbreviated CMOS process, no additional process steps to faun a semi super-junction for the p-drift region 16 are needed. The doping distribution which can be also referred to as a profile shows a discontinuous p-drift region semi super-junction or a curved drift region semi super-junction which depends on the width of the stripes 15, 32, 33 and the width of the spacings 35, 36. Therefore, the drift region 16 is similar to a super-junction structure or to a semi super-junction structure.

FIG. 2B shows an exemplary embodiment of a dopant distribution in a cross section of a semiconductor body of the invention. FIG. 2B illustrates the distribution between the drain region 12 and the source region 13 according to the embodiment of FIG. 1B in a cross section indicated by the line BB' in FIG. 1B. According to FIG. 2B, the first stripe 15 has an extension dt perpendicular to the main area 24 which has its highest value at the interface of the first stripe 15 to the channel region 14 and at the drain region 12. A doping process for the realization of a p-well, which is not shown in FIG. 2B, is used for the doping of the four stripes 15, 32-34. Additionally, a doping process for producing a p-field implantation and for an anti-punch-through implantation is used to produce the stripes. The anti-punch-through implantation and the p-field implantation process are commonly used in a standard CMOS process.

FIG. 2C shows an exemplary embodiment of a dopant distribution in a cross section of a semiconductor body of the invention. FIG. 2C shows the distribution according to the semiconductor body of FIG. 1C in a cross section indicated by the line BB' in FIG. 1C. The doping distribution of FIG. 2C is a further development of the doping distribution of FIG. 2B. Therefore, the first stripe 15 advantageously has only a small overlap with the drain region 12. The extension dp has such a high value that a punch-through between the drain region 12 and the substrate 22 can be avoided. A high punch-through voltage is a result of the separation of the stripes 15, 32, 33, 34 and the further stripes 50 to 53.

Figure 3:
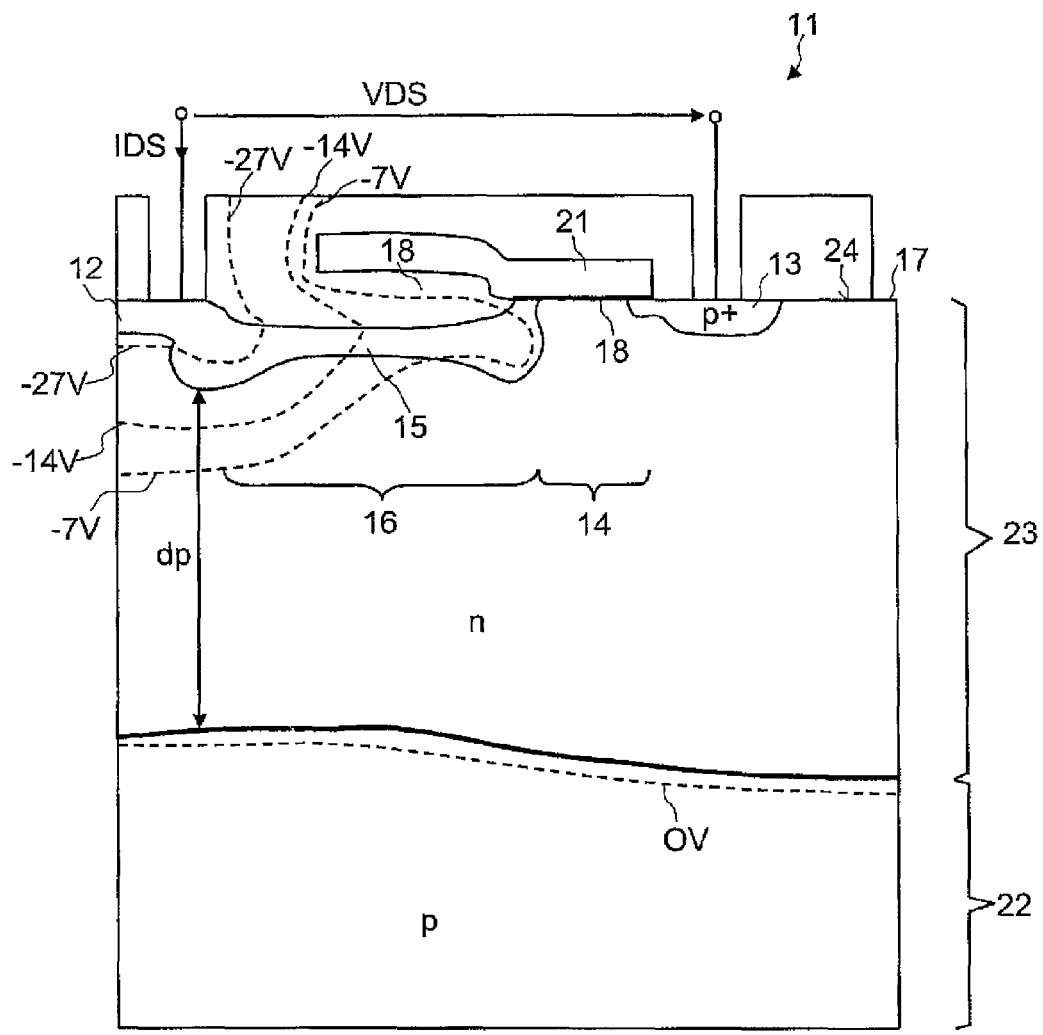
FIG. 3 shows an exemplary embodiment of a potential distribution of a semiconductor body with a field-effect transistor of the invention.

FIG. 3 shows an exemplary embodiment of a potential distribution of a semiconductor body of the invention. The distribution of the electrostatic potential lines is shown in a cross-section between the drain region 12 and the source region 13 indicated by the line BB' in FIG. 1C. A voltage of 0 V is applied to the source region 13, while a voltage of −34 V is applied to the drain region 12. Thus, a high drain-source voltage VDS is applied to the field-effect transistor 11. Since the length LD of the drift region 16 has a high value, the field-effect transistor 11 does not exhibit a punch-through even at this high value of the drain-source voltage VDS. A fully depleted drift region 16 is achieved in the blocking state by the semi super-junction structure of the drift region 16. The length L which is referred to as a channel length has a value of an interval between 0.3 μm and 1 μm.

Figure 4:
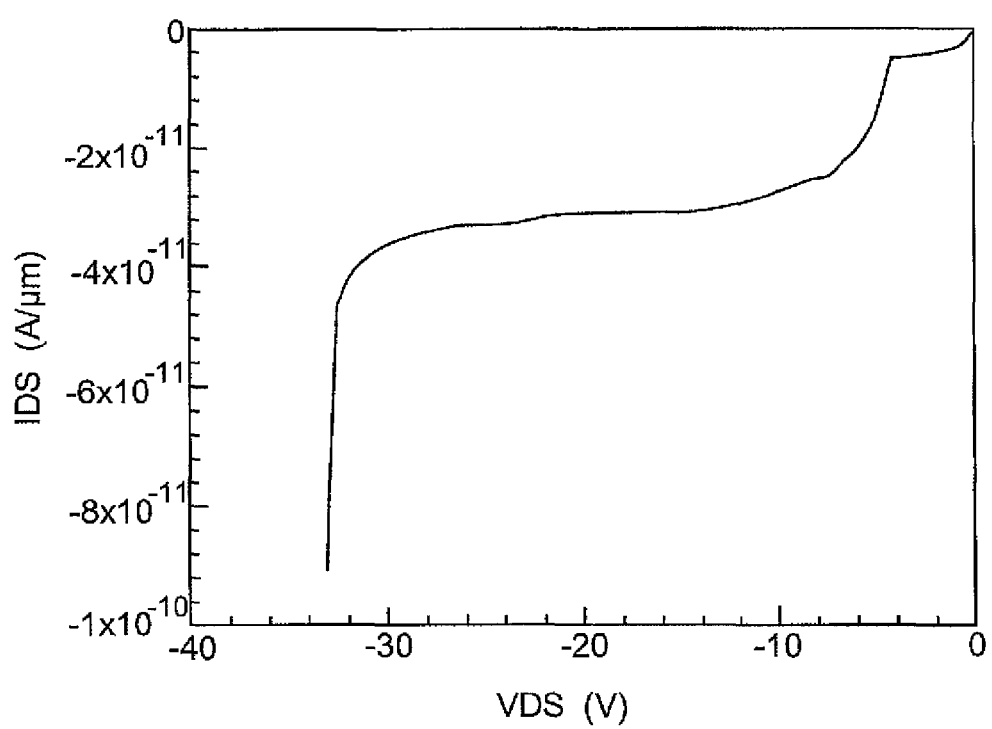
FIG. 4 shows an exemplary characteristic of a field-effect transistor of the invention.

FIG. 4 shows an exemplary embodiment of a characteristic of the field-effect transistor according to the invention. FIG. 4 shows a drain-source current IDS divided by the value of the width W of the channel region versus the drain-source voltage VDS. The drain-source current IDS flows through the channel region 14 between the drain region 12 and the source region 13. The drain-source current IDS shows low values in a voltage range of the drain-source voltage VDS between 0 V and about 33 V. At a drain-source voltage VDS larger than 33 V, the drain-source current IDS rises with a high slope.

In the blocking state of the field-effect transistor 11, the semi super-junction structure advantageously results in a fully depleted drift region 16. In addition, a punch-through behaviour between the drain region 12 and the substrate 22 can be suppressed by the use of the further stripes which extend from the drain region 12 to the further source region 38. Thus the field-effect transistor 11 is implemented as a high voltage p-channel LDMOS field-effect transistor. The field-effect transistor 11 has a blocking voltage over 30 V.

Figure 5:
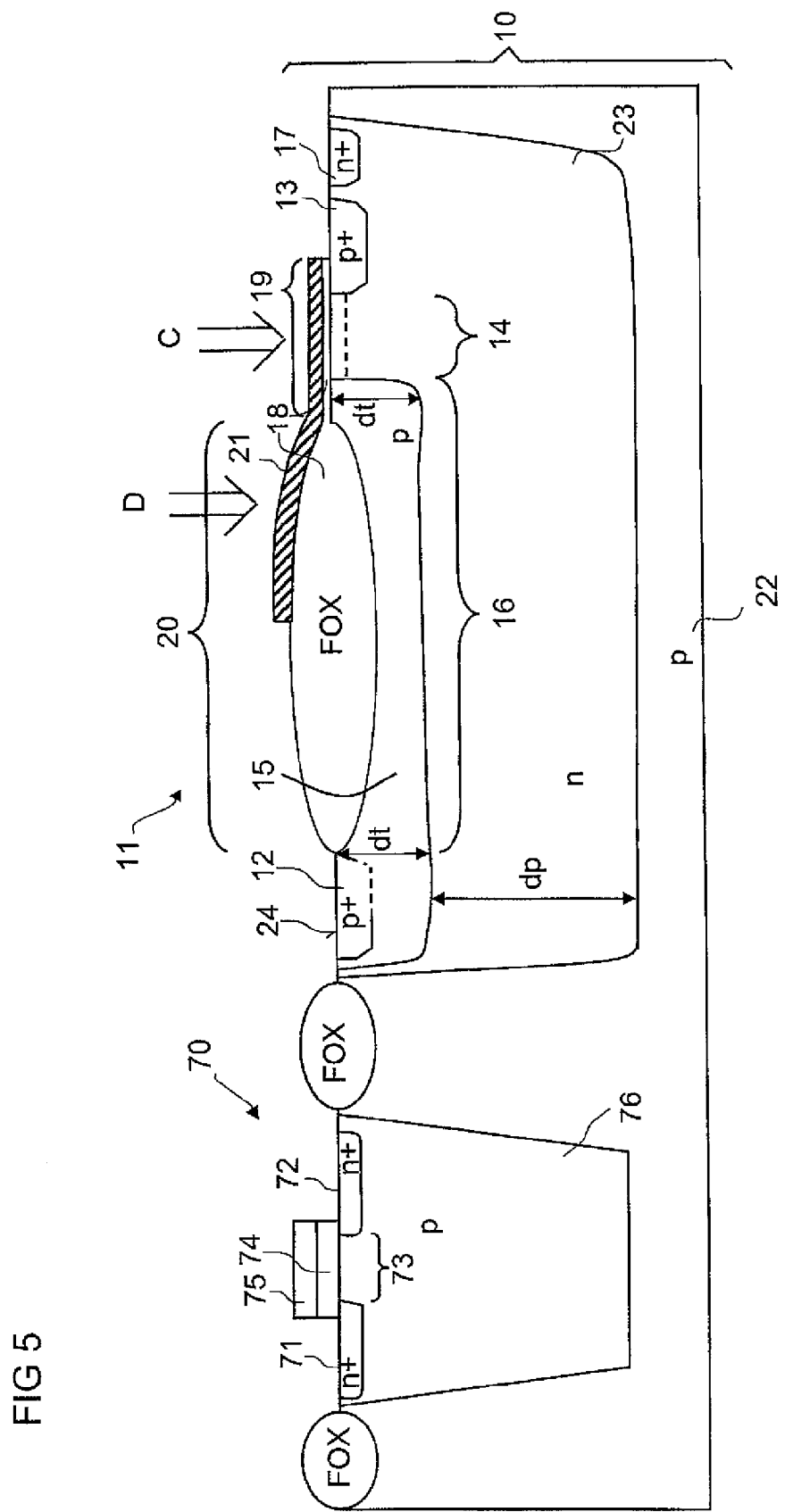
FIG. 5 shows an alternative exemplary embodiment of a semiconductor body with a field-effect transistor and a further field-effect transistor of the invention.

FIG. 5 shows an alternative exemplary embodiment of the semiconductor body with the field-effect transistor in a cross-section according to the invention. The semiconductor body of FIG. 5 is a further development of the semiconductor body of FIGS. 1A to 1C. The semiconductor body 10 further comprises an additional field-effect transistor 70. The additional field-effect transistor 70 comprises an additional drain region 71 and an additional source region 72 which is separated by an additional channel region 73. On top of the additional channel region 73, an additional gate insulator 74 and an additional gate electrode 75 are deposited. The additional transistor 70 is implemented as an n-channel field-effect transistor. The additional transistor 70 is designed for logic or analog applications. The additional transistor 70 is not realized as a high voltage field-effect transistor. The additional transistor 70 does not necessarily have to sustain high voltages.

The semiconductor body 10 comprises an additional well 76 that comprises the additional field-effect transistor 70. The additional well 76 is p-doped. The additional well 76 and the stripes 15, 32 to 34 of the field-effect transistor 11 are realized with the same mask and with the same doping process. Therefore, the stripes 15, 32 to 34 of the field-effect transistor 11 and the additional well 76 of the additional field-effect transistor have the same dopant distribution.

It is an advantage of the stripes 15, 32 to 34 that no additional mask and no additional doping process are needed for the realization of the stripes in comparison to a standard CMOS process. The mask for the realization of the additional well 76 is also used for the implantation of the anti-punch-through implantation and the p-field implantation. Only masks and process steps which are also used for the realization of other field-effect transistors such as the additional field-effect transistor 70 are used to implement the field-effect transistor 11 with a high breakdown voltage and with a high punch-through voltage. Therefore, a cost-effective realization of high voltage field-effect transistors and additional field-effect transistors is possible on the semiconductor body 10. A standard complementary metal-oxide semiconductor integration technology can advantageously be used for the production of the field-effect transistor 11. Therefore, the field-effect transistor 11 can be realized as a high voltage transistor in a standard CMOS process without additional mask steps.

Figure 6:
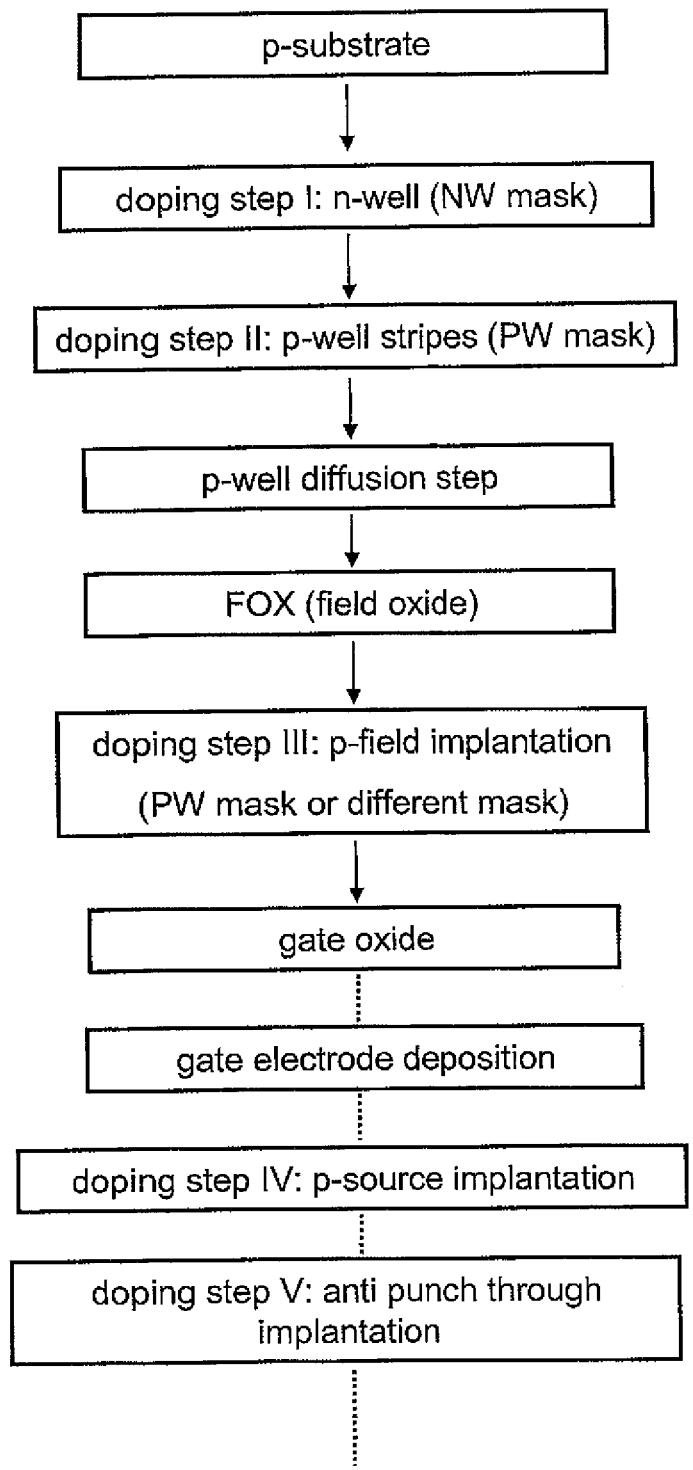
FIG. 6 shows an exemplary embodiment of a process flow for fabricating the semiconductor body of the invention.

FIG. 6 shows an exemplary embodiment of a process flow for fabricating the semiconductor body of the principle presented. The process flow comprises providing the substrate 22. The substrate 22 can be a p-doped substrate. Further on the process comprises a first doping step I. The first doping step I is implemented as a n-well doping step. The first doping step I comprises a transfer of a pattern of an n-well mask NW to the semiconductor body 10 and an ion implantation step.

Furthermore, the process flow comprises a second doping step II. The second doping step II is adapted as a well doping step. The second doping step II is implemented as a p-well doping step. For the second doping step II, a pattern of a p-well mask PW is transferred to the semiconductor body 10 and an ion implantation step is performed. By the second doping step II, the additional p-well 76 and the p-well stripes 15, 32 to 34 of the drift region 16 are realized. The second doping step II is additionally implemented to produce the further stripes 50 to 53.

Moreover, the process flow comprises a diffusion step. The dopants which are implanted in the semiconductor body 10 by the first and the second doping steps I, II are diffused by the diffusion step. The diffusion step is implemented as a p well diffusion step. Further on, the process flow comprises an oxidation step. By the oxidation step, a field oxide, abbreviated FOX, is fabricated. The diffusion of the dopants continues during the oxidation step. Additionally, the process flow comprises a third doping step III. The third doping step III is implemented as a field doping step. By the third doping step III, the p-well mask PW is used again. In the third doping step III, a p-field implantation step is performed. Furthermore, the process flow comprises an oxidation of a gate oxide which is part of the gate insulator 18. A gate electrode deposition process follows the fabrication of the gate insulator 18. The gate electrode 21 is deposited by the gate electrode deposition process on top of the gate insulator 18.

In a further step, a fourth doping step IV is performed. The fourth doping step IV is implemented to produce the drain region 12, the source region 13 and the further source region 38. The fourth doping step IV is a source doping step. In the fourth doping step IV, the dopants for the drain region 12, the source region 13 and the further source region 38 are implanted. Thus the fourth doping step IV comprises a p source doping step that is performed by ion implantation.

Further on, a fifth doping step V is performed that is implemented as an anti-punch-through implantation step. The p well mask PW is used for the fifth doping step V.

Additional steps are performed to fabricate the field-effect transistor 11 according to a standard CMOS process. Therefore, starting from a standard CMOS process, neither additional masks nor additional doping steps are necessary for the realization of the p-drift region 16 in the n-well 33.

Alternatively a field mask FW which is different to the p well mask PW can be used for the third doping step III instead of the p-well mask PW. Alternatively, an anti-punch-through mask is used for the fifth doping step V which is different from the p well mask PW.

In an alternative embodiment which is not shown, the second doping step II that is implemented to produce the stripes 15, 32, 33, 34 and the further stripes 50 to 53 is performed as the first doping step. Moreover, the fourth doping step IV that is implemented to produce the drain region 12, the source region 13 and the further source region 38 can be performed as the second doping step.

Figure 7:
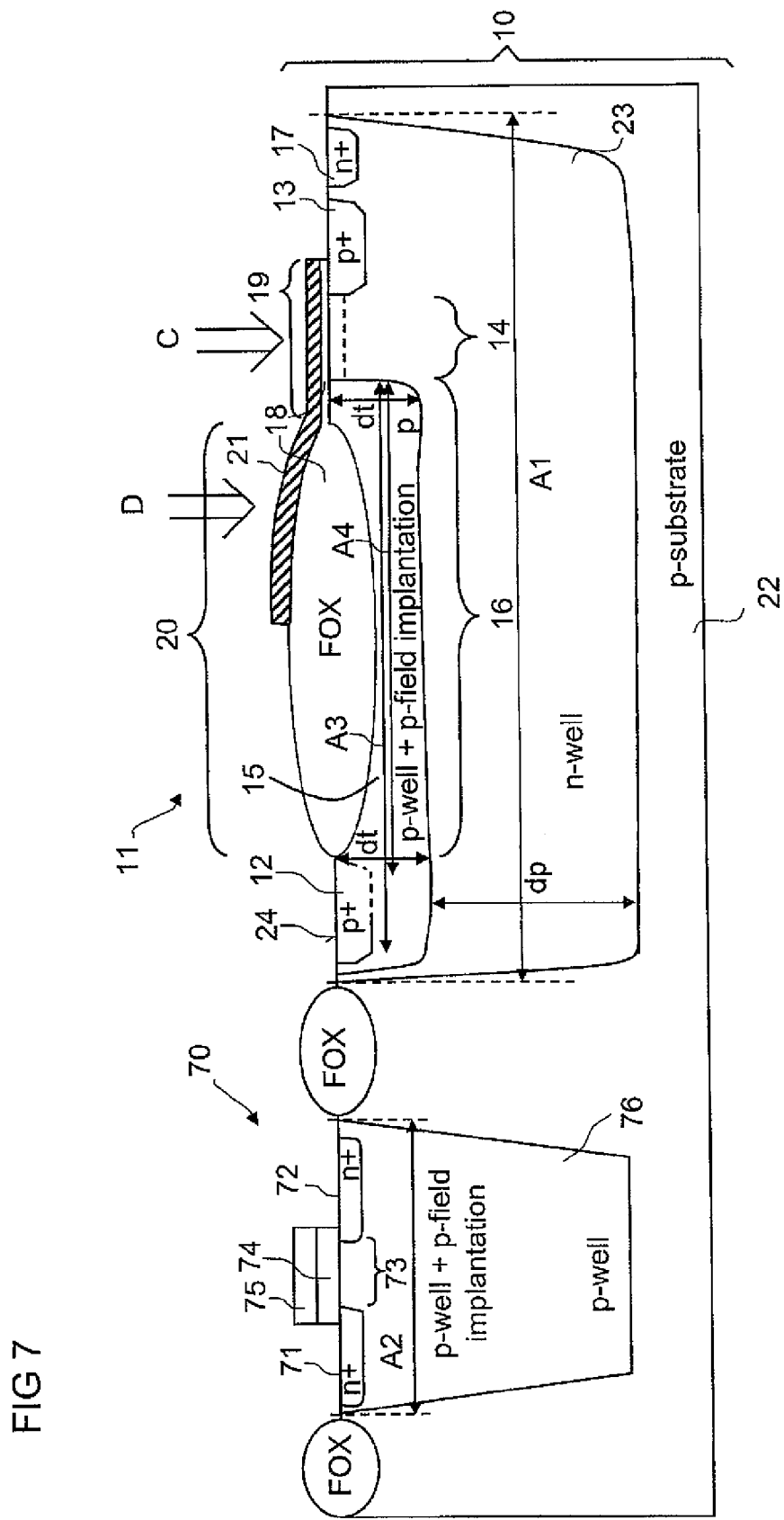
FIG. 7 shows an alternative exemplary embodiment of the semiconductor body with the field-effect transistor and the farther field-effect transistor of the invention.

FIG. 7 shows an alternative exemplary embodiment of the semiconductor body with the field-effect transistor in a cross-section according to the invention. The semiconductor body of FIG. 7 is a further development of the semiconductor body of FIGS. 1A to 1C and 5. The semiconductor body 10 comprises the substrate 22, the additional well 76 and the well 23. The substrate 22 is implemented as a p substrate. The well 23 is implemented as an n well. The additional well 76 is implemented as a p well.

The process flow for fabricating the semiconductor 10 of FIG. 7 is described in FIG. 6. The first doping step I is used to implement the well 23. The first main area 24 comprises a first area A1. The first area A1 includes that area of the first main area 24 which is comprised by the well 23. The first doping step I is the n well doping step. The n well mask NW comprises a structure which corresponds to the first area A1. The structure of the n well mask NW is equal to the first area A1, if the diffusion processes are neglected.

The additional well 76 and the stripes 15, 32 to 34 are fabricated by means of the second doping step II. The first main area 24 comprises a second area A2. The second area A2 includes those areas of the first main area 24 which are comprised by the additional well 76. The first main area 24 comprises a third area A3. The third area A3 is inside of the first area A1. The third area A3 comprises the stripes 15, 32 to 34, which are shown in FIG. 1B, of the drift region 16. The third area A3 has an overlap with the drain region 12. The drift region 16 is implemented as a p drift region. The second doping step II is the p well implantation step. The p well mask PW comprises structures which correspond to the second and to the third areas A2, A3. The p well mask PW is used for the fabrication of the additional well 76 and the stripes 15, 32 to 34.

Moreover, the third doping step III is used for fabricating the additional well 76 and the stripes 15, 32 to 34. The third doping step III is implemented as a p field implantation. The p well mask PW is also used for the doping step III. Thus, the additional well 76 having the second area A2 and the stripes 15, 32 to 34 having the third area A3 are fabricated using the second and the third doping steps II, III.

In an alternative embodiment, a p field mask FW is used for the third doping step III instead of the p well mask PW. The structures on the p well mask PW and on the p field mask FW are different in the drift region 16. Thus by different openings in the p field mask FW and the p well mask PW, the doping concentrations of the stripes 15, 32 to 34 and of the spacings 35 to 37 can be further optimized to achieve a low resistance of the drift region 16 and a high breakdown voltage.

In an alternative embodiment, a fourth area A4 comprises the stripes 15, 32 to 34 according to the embodiment which is shown in FIG. 1C. The fourth area A4 is smaller than the third area A3. The fourth area A4 extends from the channel region 14 to the drain region 12. The fourth area A4 has only a small overlap with the drain region 12. The overlap can be 10% or less of the area of the drain region 12. The fourth area A4 is fabricated by the use of the second and the third doping steps II, III.

The source region 13 and the drain region 12 are fabricated by the fourth doping step IV that is implemented as p source doping step.

In an alternative embodiment which is not shown the field-effect transistor 11 comprises the further source region 38 according to FIG. 1B. In another alternative embodiment, the field-effect transistor 11 comprises the further source region 38 and the further stripes 50 to 53 according to FIG. 1C.

In an alternative embodiment, n dopants can be used instead of p dopants and p dopants can be used instead of n dopants in the semiconductor body 10 that is described in the Figures.

The invention claimed is:
1. A semiconductor body, comprising:
a first field-effect transistor which comprises:
   a drain region of a first conduction type;
   a source region of the first conduction type;
   a drift region comprising at least two stripes of the first conduction type which extend from the drain region in a direction towards the source region;
   a channel region of a second conduction type which is opposite to the first conduction type, the channel region being arranged between the drift region and the source region;
   a further source region of the first conduction type;
   a further drift region comprising at least two further stripes of the first conduction type which extend from the drain region in a direction towards the further source region; and
   a further channel region of the second conduction type, the further channel region being arranged between the further drift region and the further source region,
   wherein the further stripes are separated from the stripes by a distance that is located between the stripes and the further stripes;
a first well of the second conduction type in which the first field-effect transistor is arranged; and
a second well of the first conduction type in which a second field-effect transistor is arranged,
wherein the drain region, the source region, the channel region and the at least two stripes are arranged at a first main area of the semiconductor body, and
wherein an extension of the at least two stripes and of the at least two further stripes has a thickness perpendicular to a surface of the first main area greater than a thickness of an extension of the drain region perpendicular to the surface of the first main area.

2. The semiconductor body according to claim 1, wherein the at least two stripes have approximately parallel main directions.

3. The semiconductor body according to claim 2, wherein the main direction of the at least two stripes is approximately parallel to the first main area of the semiconductor body.

4. The semiconductor body according to claim 1, wherein an extension of a first stripe of the at least two stripes from the drain region in the direction towards the source region has a larger value than a width of the first stripe.

5. The semiconductor body according to claim 1, wherein the drift region comprises a spacing which separates the at least two stripes.

6. The semiconductor body according to claim 1, wherein the drift region comprises:
   a super junction structure formed by the at least two stripes and by the spacing of the second conduction type, or
   a semi super junction structure formed by the at least two stripes and by the spacing with a low doping concentration of the first conduction type, wherein the spacing of the semi super-junction structure has a lower dopant concentration than the stripes.

7. The semiconductor body claim 1, wherein the first conduction type is p doped and the second conduction type is n doped, or wherein the first conduction type is n doped and the second conduction type is p doped.

8. The semiconductor body according to claim 1, wherein the first field-effect transistor further comprises a gate insulator which is arranged on the drift region and the channel region.

9. The semiconductor body according to claim 8, wherein the gate insulator comprises:
   a first area in which the gate insulator has a first thickness, and
   a second area in which the gate insulator has a second thickness that has a larger value than the first thickness.

10. The semiconductor body according to claim 8, wherein the first field-effect transistor further comprises a gate electrode which is arranged on the gate insulator.

11. The semiconductor body according to claim 10, wherein the gate insulator comprises an area which is arranged on the drift region and which is uncovered by the gate electrode.

12. A method for producing field-effect transistors in a semiconductor body, comprising:
   for a first field-effect transistor:
      executing a first doping step at a first main area of the semiconductor body;
      executing a second doping step at the first main area;
      executing a thermal treatment for a diffusion of a first dopant of the first doping step to produce at least two stripes and at least two further stripes of the first field-effect transistor and for a diffusion of a second dopant of the second doping step to produce a drain region, a source region and a further source region of the first field-effect transistor, wherein the at least two stripes extend from the drain region in a direction towards the source region, the at least two further stripes extend from the drain region in a direction towards the further source region as well as the further stripes are separated from the stripes;
      depositing a gate electrode configured to control the first field-effect transistor; and
      forming a first well of a first conduction type in which the first field effect transistor is arranged; and
   for a second field-effect transistor:
      forming a second well of a second conduction type opposite the first conduction type in which the second field effect transistor is arranged,
      wherein the stripes and the second well are realized by the execution of the first doping step,
      wherein a same mask and ion implantation step are used for the realization of the stripes and the second well.

13. The method according to claim 12, further comprising executing a field doping step at the first main area, wherein the first doping step and the field doping step produce the at least two stripes and the at least two further stripes of the first field-effect transistor.

14. The method according to claim 13, wherein a well mask is used for the first doping step and the field doping step.

15. The semiconductor body according to claim 1, wherein the distance that is located between the stripes and the further stripes comprises a separation distance such that a doping concentration between the drain region and a substrate is reduced.

16. The semiconductor body according to claim 1, wherein the at least two stripes have a small overlap with the drain region and the at least two further stripes have a small overlap with the drain region.

17. A semiconductor body, comprising:
   a first field-effect transistor which comprises:
      a drain region of a first conduction type;
      a source region of the first conduction type;
      a drift region comprising at least two stripes of the first conduction type which extend from the drain region in a direction towards the source region;
      a channel region of a second conduction type which is opposite to the first conduction type, the channel region being arranged between the drift region and the source region;
      a further source region of the first conduction type;
      a further drift region comprising at least two further stripes of the first conduction type which extend from the drain region in a direction towards the further source region; and
      a further channel region of the second conduction type, the further channel region being arranged between the further drift region and the further source region,
      wherein the further stripes are separated from the stripes by a distance that is located between the stripes and the further stripes;
   a first well of the second conduction type in which the first field-effect transistor is arranged; and
   a second well of the first conduction type in which a second field-effect transistor is arranged,
   wherein the drain region, the source region, the channel region and the at least two stripes are arranged at a first main area of the semiconductor body,
   wherein an extension of the at least two stripes and of the at least two further stripes has a thickness perpendicular to a surface of the first main area greater than a thickness of an extension of the drain region perpendicular to the surface of the first main area, and
   wherein the drift region comprises a semi super junction structure formed by the at least two stripes and by a spacing between the at least two stripes with a low doping concentration of the first conduction type, and wherein the spacing of the semi super-junction structure has a lower dopant concentration than the stripes.

* * * * *